United States Patent [19]

Numata

[11] 3,950,620

[45] Apr. 13, 1976

[54] ELECTRIC CIRCUIT CONTAINING AN INTEGRAL PHASE-LOCKED LOOP

[75] Inventor: Tatuo Numata, Tokyo, Japan

[73] Assignee: Pioneer Electronic Corporation, Tokyo, Japan

[22] Filed: Nov. 25, 1974

[21] Appl. No.: 526,995

[30] Foreign Application Priority Data
Nov. 26, 1973 Japan.............................. 48-132337

[52] U.S. Cl............................. 179/15 BT; 325/315
[51] Int. Cl.²......................................... H04H 5/00
[58] Field of Search........ 179/15 BT; 325/315, 316, 325/317; 329/50, 112, 110; 331/2, 8, 14, 16, 18

[56] References Cited
UNITED STATES PATENTS

| | | |
|---|---|---|
| 3,209,271 | 9/1965 | Smith.................................. 329/50 |
| 3,210,684 | 10/1965 | Morrison ............................. 331/16 |
| 3,293,560 | 12/1966 | Tschannen............................ 331/8 |
| 3,562,791 | 2/1971 | Baker .................................. 179/1 HF |
| 3,619,804 | 11/1971 | Mears .................................. 331/14 |
| 3,665,507 | 5/1972 | Peil ...................................... 325/444 |

Primary Examiner—Douglas W. Olms
Attorney, Agent, or Firm—Sughrue, Rothwell, Mion, Zinn & Macpeak

[57] ABSTRACT

A circuit containing an integral phase-locked loop and operative in a first mode, in which the loop is required, and in a second mode in which the loop is not required; and means for selectively rendering the loop inoperative by selectively disabling the voltage-controlled oscillator thereof.

9 Claims, 3 Drawing Figures

ELECTRIC CIRCUIT CONTAINING AN INTEGRAL PHASE-LOCKED LOOP

BACKGROUND OF THE INVENTION

1. Field of the Invention

This invention relates to an electric circuit containing an integral phase-locked loop, and, more particularly, to an improvement thereof whereby the phase-locked loop may be selectively disabled to permit operation of the circuit in a mode in which the loop is not required.

2. Description of the Prior Art

Recently, the advantageous features of the phase-locked loop (hereinafter abbreviated to PLL) have been widely utilized, for instance, in the fields of FM detecting circuits, FM stereophonic multiplex circuits, and AM detecting circuits, and integrated circuits for these applications are readily available on the market. The PLL inherently comprises a phase difference detector, a d.c. amplifier, and a voltage-controlled oscillator which is continuously operated even in an operational mode of the circuit where the PLL is not utilized. The drawback of such an arrangement is that the output oscillation signal from the voltage-controlled oscillator, including higher harmonics, interferes, with other devices, such as audio circuits. In view of this drawback, it would be advantageous to put the PLL in an inoperative state in the cases where the PLL is utilized in a circuit wherein two series of amplifiers are employed, as in the cases of simply reproducing recorded discs or recorded tapes. Of course, it is possible to put the PLL into an inoperative state by merely turning the power source to an OFF state. However, ON-OFF operations of the power source cause transient phenomena in the circuit which in turn give rise to the creation of noise in the sound from the loudspeakers.

SUMMARY OF THE INVENTION

The present invention is directed to the elimination of the above described drawback of the conventional construction, and a primary object is to provide an improved arrangement wherein the oscillation in the voltage-controlled oscillator constituting a principal constituent of the PLL circuit is terminated in an operational mode not utilizing the PLL circuit, and any hazardous influence of the higher harmonics thereof is thereby eliminated.

The present invention will now be described in detail with reference to the accompanying drawing which illustrates a preferred embodiment of the invention.

DETAILED DESCRIPTION OF THE PREFERRED EMBODIMENT

Figure 1:
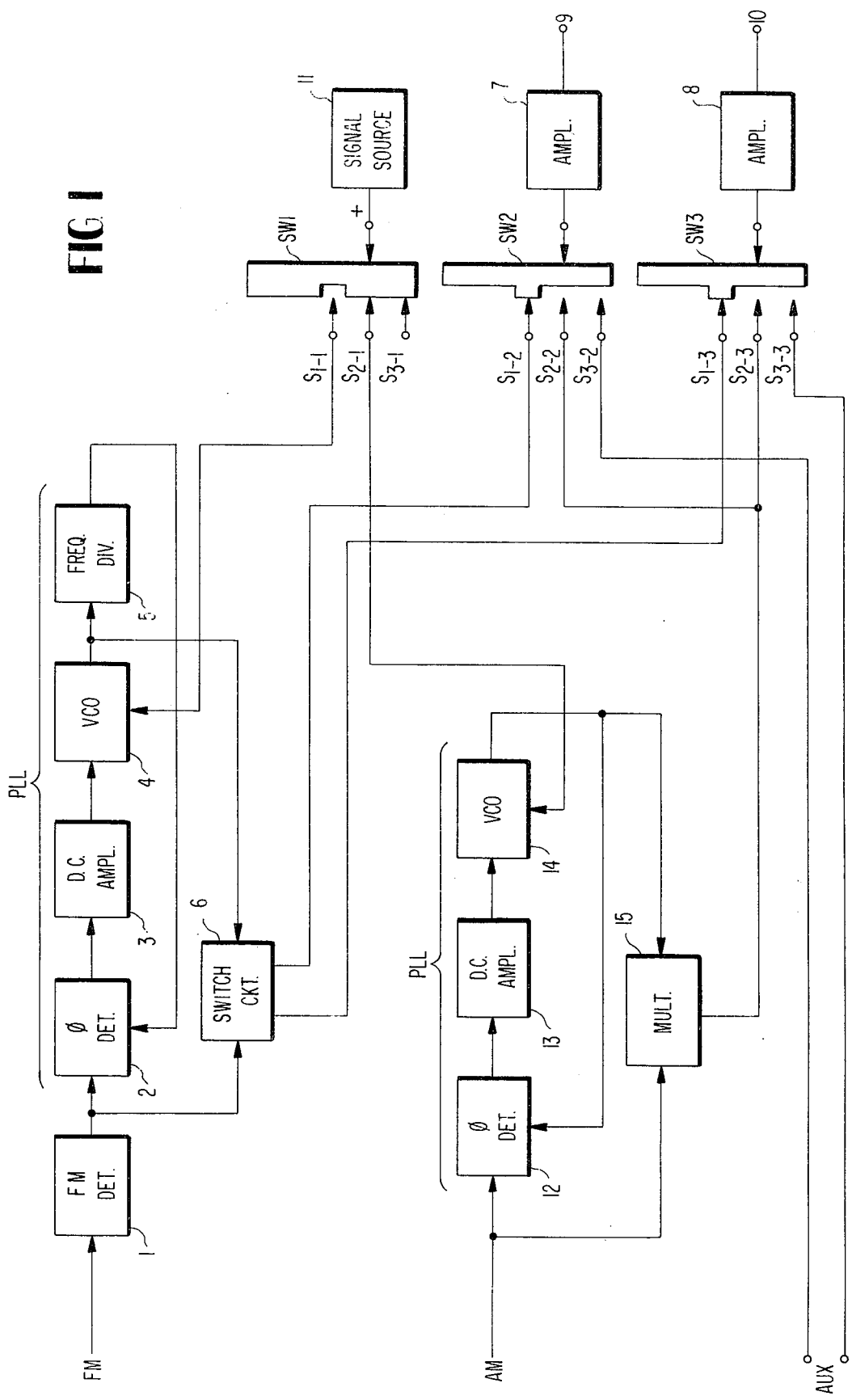
FIG. 1 is a block diagram showing an embodiment of the present invention.

In FIG. 1, there is illustrateed a block diagram of a so-called two-channel stereo receiver which includes an FM stereo multiplex circuit and an AM detecting circuit. Each of the circuits includes a PLL. In the drawwing, numeral 1 designates an FM detector delivering a composite signal within which a pilot signal of 19 KHz is thereafter sent through a PLL comprising a phase difference detector 2, a d.c. amplifier 3, a voltage-controlled oscillator 4, and a frequency divider 5 such as a flip-flop or the like, thereby locking the PLL at 19 KHz of the pilot signal. The voltage-controlled oscillator 4 is oscillated while it is locked to 38 KHz, i.e., twice the frequency of the 19 KHz pilot signal, and the output thereof is applied to a switching circuit 6 thereby to operate the switching circuit to demodulate the output signal from the FM detector 1 into two channels of FM stereophonic output signals. The two channels of FM stereophonic output signals are then led to terminals $S_{1-2}$ and $S_{1-3}$ in two switch portions $SW_2$ and $SW_3$ within three-stage ganged switches $SW_1$ through $SW_3$, through which the two channels of the output signals are applied to amplifiers 7 and 8 so that output stereophonic signals are obtained from the output terminals 9 and 10 of the amplifiers 7 and 8. During this mode of operation, a d.c. positive voltage from a signal source 11 is interrupted by the switch $SW_1$ from being connected via switch terminal $S_{1-1}$ to the voltage-controlled oscillator 4, and the oscillator 4 is thereby operated in normal manner.

On the other hand, a modulated input signal, which is obtained through AM modulation of a carrier wave by a voice signal, is applied to a second PLL comprising a phase difference detector 12, a d.c. amplifier 13, and a voltage-controlled oscillator 14, thereby locking this PLL to the frequency of the carrier wave. Simultaneous therewith, the above-mentioned input signal and the output signal from the voltage-contolled oscillator 14 are both applied to a multiplier 15 thereby obtaining an AM demodulated signal. In the operational mode shown in FIG. 1, the entire circuit is operated in an FM multidemodulation mode, during which the second PLL is maintained in an inoperative state by applying the positive voltage from signal source 11 to the voltage-controlled oscillator 14 through the switch $SW_1$ and terminal $S_{2-1}$.

When the ganged switches $SW_1$ through $SW_3$ are transferred to "AUX" position, only an input signal applied to the "AUX" terminals is applied via the switch terminals $S_{3-2}$ and $S_{3-3}$ to the amplifiers 7 and 8, and both of the voltage-controlled oscillators 4 and 14 are made inoperative through the application of the d.c. positive voltage to the oscillators 4 and 14 via switch terminals $S_{1-1}$ and $S_{2-1}$ respectively.

Figure 2:
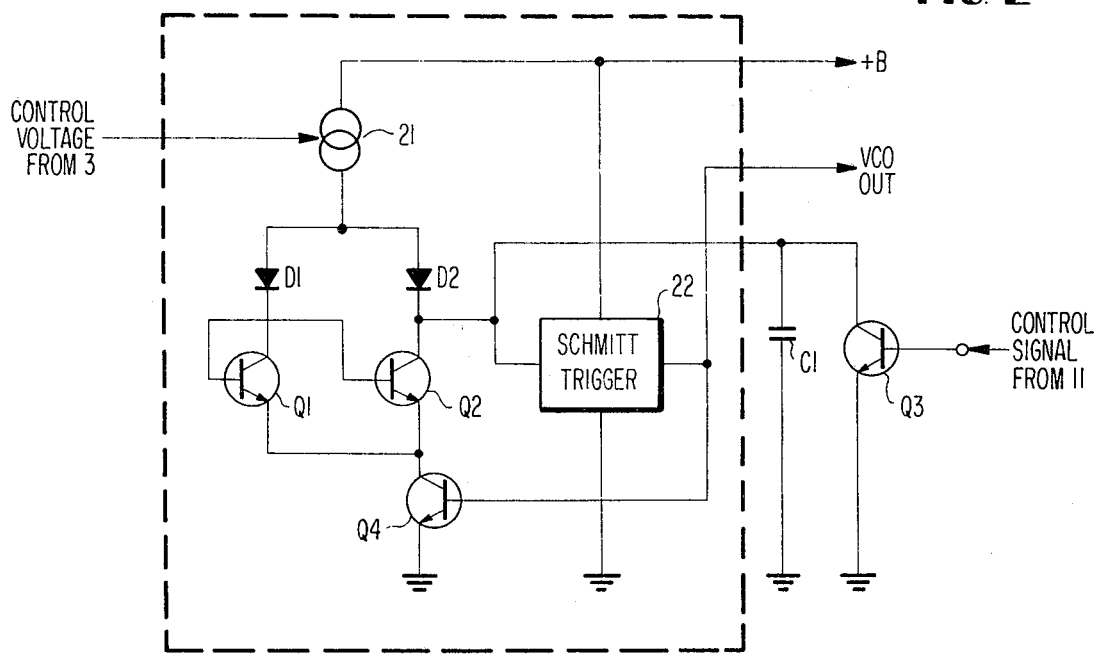
FIGS. 2 and 3 are circuit diagrams showing examples of voltage-controlled oscillator included in the PLL circuit.

In FIG. 2, there is indicated an example wherein the voltage-controlled oscillator (VCO) constituting a component of the PLL circuit is made in the form of a Schmitt trigger circuit. The part surrounded by a broken line in the drawing is formed into various integrated circuits of which NE565 and NE566 are typical.

A control voltage from the d.c. amplifier 3 is applied to a constant current source 21, thereby limiting the amount of current flowing into the control circuit comprising diodes $D_1$ and $D_2$ and transistors $Q_1$ and $Q_2$. The Schmitt trigger circuit 22 is connected to the collector of the transistor $Q_2$, and a capacitor $C_1$ for determining the oscillation frequency is connected in parallel with the Schmitt trigger circuit 22. Furthermore, an NPN transistor $Q_3$ is connected in parallel with the capacitor $C_1$ and with the input terminal of the Schmitt trigger circuit 22. Thus, when a control signal in the form of a d.c. voltage higher than +0.7 V is applied to the base of the transistor $Q_3$, the transistor conducts, and the voltage applied across the capacitor $C_1$ is thus lowered. The resulting lowering or grounding of the input voltage of the Schmitt trigger circuit 22 terminates the operation thereof.

Describing the operation of the VCO shown in FIG. 2 in relation to the circuit shown in FIG. 1, this VCO may be incorporated in the FM multiplex circuit as VCO 4. In this case, the base of the transistor $Q_3$ is connected with the terminal $S_{1-1}$ in the switch $SW_1$. The exemplary VCO of FIG. 2 may also be incorporateed in the AM detector circuit in FIG. 1 as VCO 14, and in this case, the base of the transistor $Q_3$ is connected with the terminal $S_{2-1}$ of the switch $SW_1$.

Figure 3:
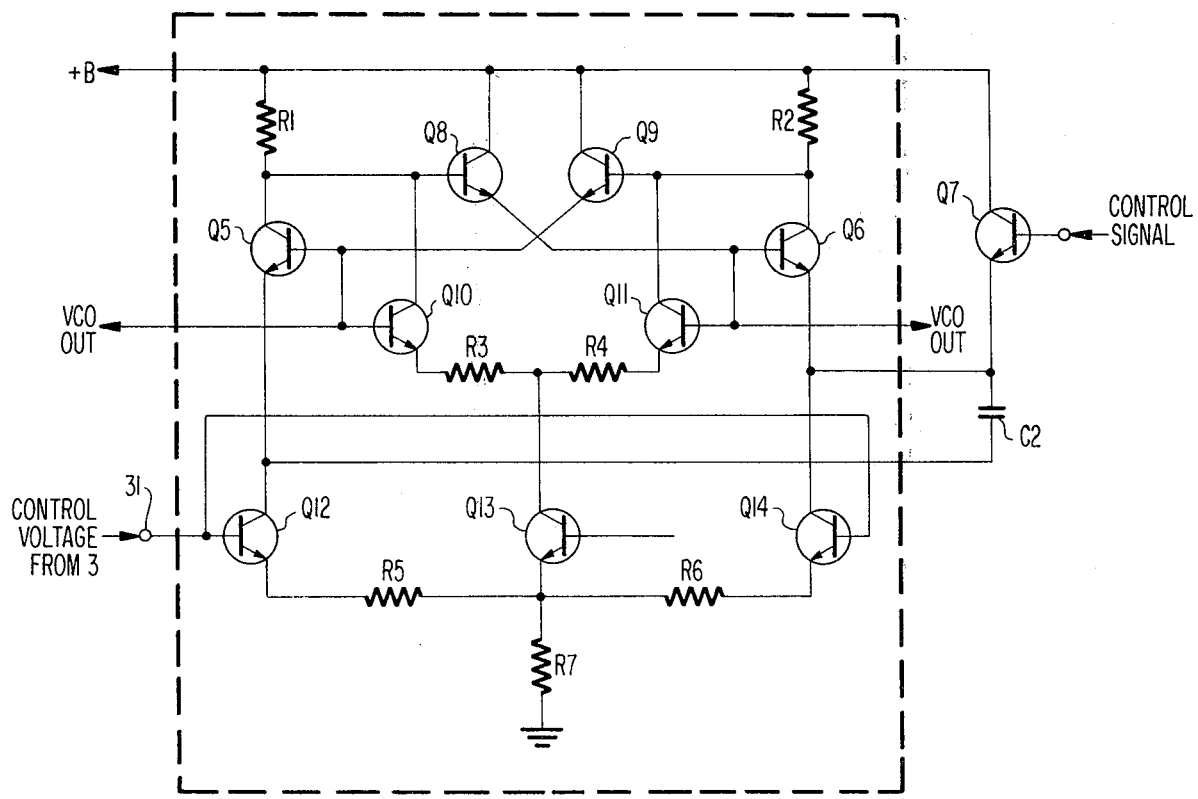

In FIG. 3, there is illustrated another form of a voltage-controlled oscillator utilizing a multivibrator. The part surrounded by the broken line in FIG. 3 is formed into various integrated circuits of which NE561 and NE562 are typical. Since these integrated circuits per se are not part of the present invention, detailed description of their operation will be omitted.

In brief, a control voltage from d.c. amplifier 3 in FIG. 1 is applied to a terminal 31 of the circuit surrounded by the broken line, whereby the transistors $Q_5$ and $Q_6$ are caused to repeat ON-OFF operation alternately at a frequency depending on the magnitude of input control votlage. In the example shown in FIG. 3, another PNP transistor $Q_7$ is provided between the collector and emitter of the transistor $Q_6$, and the oscillation of the multivibrator is terminated by applying a control signal to the base of the transistor $Q_7$, rendering transistor $Q_7$ conductive and short-circuiting transistor $Q_6$. It will be clearly understood that in this example, the multivibrator is operated when +B voltage is applied to the base of the transistor $Q_7$, and the operation of the multivibrator is terminated when a voltage lower than 0.7 V is applied to the base of the same transistor.

Accordingly, the relation between the operation of the oscillator and the applied control voltage is just reverse of that of the Schmitt trigger type oscillator shown in FIG. 2. For this reason, the contact arrangement in the switch $SW_1$ in FIG. 1 cannot be used for the example shown in FIG. 3, and hence a minor change must be made for this part of the circuit.

Among voltage controlled oscillators, there are MC1310P and μA758 besides the above described types, and in these types, oscillation can be terminated by simply grounding the input terminal. Thus, when an operational mode requiring no PLL circuit is selected, the object of the invention can be achieved by so composing the circuit that the input terminal thereof is grounded through a ganged switch or a switching element, such as a transistor.

Since the invention is organized as described above, the transient phenomenon caused by ON-OFF control of the power source for PLL circuit can be eliminated. Furthermore, when the electric apparatus is operated in a mode not requiring the PLL, the voltage-controlled oscillator thereof can be sureby brought into inoperative state, and the interference of higher harmonics to other apparatuses can be thereby prevented. In addition, the operation of the voltage-controlled oscillator can be terminated without varying the oscillator portion thereof, whereby any possibility of deteriorating the stability in operation of the voltage-controlled oscillator due to circumferential conditions and other factors can be substantially eliminated.

Although the preferred embodiment of the invention has been described with respect to a so-called two-channel stereo receiver circuit, the invention is not restricted to such a specific circuit, but rather is applicable to various other circuits and apparatuses containing a PLL and utilizing the PLL upon requirement; therefore, various modifications and alterations can be effectuated without departing from the scope and spirit of the present invention as defined in the appended claims.

I claim:

1. In an electric circuit having a first integral phase-locked loop including a phase-difference detector, an amplifier and a voltage-controlled oscillator connected in a closed loop, said circuit having a first mode of operation wherein said loop is required, and a second mode of operation wherein said loop is not required, the improvement comprising means for continuously applying operating power to said oscillator in both of said modes so that said oscillator is operative to oscillate during said first mode, and disabling means connected to said oscillator for rendering said oscillator inoperative in said second mode even though the operating power is continually applied to said oscillator, whereby said oscillator does not oscillate in said second mode.

2. The improvement as defined in claim 1 wherein said means comprises switch means operative electrically to disable the voltage-controlled oscillator of said loop.

3. The improvement as defined in claim 2 wherein the voltage-controlled oscillator contains a Schmitt trigger, and further comprising circuit means connected to said switch means for grounding the input of said Schmitt trigger to render said oscillator inoperative.

4. The improvement as defined in claim 3 wherein said circuit means comprises a normally non-conducting transistor connected between ground and the input of said Schmitt trigger and responsive to operation of said switch means to become conducting to ground said input.

5. The improvement as defined in claim 2 wherein the voltage-controlled oscillator contains a multivibrator including a pair of crosscoupled transistor means which alternately turn ON and OFF, and further comprising circuit means for short-circuiting one of said transistor means, thereby rendering said oscillator inoperative.

6. The improvement as defined in claim 5 wherein said circuit means comprises a normally non-conducting transistor connected across said one transistor means, and responsive to operation of said switch means to become conducting to short-circuit said one transistor means.

7. The improvement as defined in claim 1 wherein said circuit comprises a second integral phase-locked loop which is required for said second mode but not for said first mode, and said disabling means compises switch means connected to both of the oscillators and operative electrically to simultaneously render inoperative the voltage-controlled oscillator of said first loop and render operative the voltage-controlled oscillator of said second loop.

8. The improvement as defined in claim 7 wherein said circuit is a two-channel stereo receiver including an FM stereo multiplex circuit having one of said loops connected therein, an AM detecting circuit having the other of said loops connected therein, and output amplifier means common to said FM and AM circuits and operatively connected thereto, respectively, via said switch means only when the corresponding loop is rendered operative.

9. The improvement as defined in claim 8 wherein said circuit comprises a signal path, independent of said first and second loops, but connected via said switch means to said common output amplifier means, said switch means also being operative simultaneously to render both of said loops inoperative and to connect said signal path directly to said amplifier means.

* * * * *